United States Patent
Eisele et al.

(10) Patent No.: US 11,776,932 B2
(45) Date of Patent: Oct. 3, 2023

(54) PROCESS AND DEVICE FOR LOW-TEMPERATURE PRESSURE SINTERING

(71) Applicant: DANFOSS SILICON POWER GMBH, Flensburg (DE)

(72) Inventors: Ronald Eisele, Surendorf (DE); Holger Ulrich, Eisendorf (DE)

(73) Assignee: Danfoss Silicon Power GmbH, Flensburg (DE)

( * ) Notice: Subject to any disclaimer, the term of this patent is extended or adjusted under 35 U.S.C. 154(b) by 922 days.

(21) Appl. No.: 15/514,598

(22) PCT Filed: Sep. 21, 2015

(86) PCT No.: PCT/EP2015/071613
§ 371 (c)(1),
(2) Date: Mar. 27, 2017

(87) PCT Pub. No.: WO2016/050548
PCT Pub. Date: Apr. 7, 2016

(65) Prior Publication Data
US 2017/0229424 A1 Aug. 10, 2017

(30) Foreign Application Priority Data
Sep. 29, 2014 (DE) .......................... 102014114093.1

(51) Int. Cl.
*B23K 1/00* (2006.01)
*H01L 23/00* (2006.01)
(Continued)

(52) U.S. Cl.
CPC ................ *H01L 24/83* (2013.01); *B22F 3/14* (2013.01); *B23K 1/0016* (2013.01); *H01L 24/32* (2013.01);
(Continued)

(58) Field of Classification Search
CPC ......... H01L 24/83; H01L 24/75; H01L 24/32; H01L 2224/83201; H01L 2224/83095;
(Continued)

(56) References Cited

U.S. PATENT DOCUMENTS

| | | | |
|---|---|---|---|
| 2,900,287 A | 8/1959 | Bestler et al. | |
| 2,922,092 A | 1/1960 | Gazzara et al. | |

(Continued)

FOREIGN PATENT DOCUMENTS

| | | | |
|---|---|---|---|
| CN | 1462067 A | 12/2003 | |
| CN | 1823409 A | 8/2006 | |

(Continued)

OTHER PUBLICATIONS

Machine translation of JP-2006-352080A (no date available).*

(Continued)

*Primary Examiner* — Kiley S Stoner
(74) *Attorney, Agent, or Firm* — McCormick, Paulding & Huber PLLC (57) ABSTRACT

Process for producing an electronic subassembly by low-temperature pressure sintering, comprising the following steps: arranging an electronic component on a circuit carrier having a conductor track, connecting the electronic component to the circuit carrier by the low-temperature pressure sintering of a joining material which connects the electronic component to the circuit carrier, characterized in that, to avoid the oxidation of the electronic component or of the conductor track, the low-temperature pressure sintering is carried out in a low-oxygen atmosphere having a relative oxygen content of 0.005 to 0.3%.

21 Claims, 5 Drawing Sheets

(51) Int. Cl.
 *H05K 3/32* (2006.01)
 *B22F 3/14* (2006.01)
(52) U.S. Cl.
 CPC ............ *H01L 24/75* (2013.01); *H05K 3/32* (2013.01); *B22F 2301/10* (2013.01); *B22F 2301/255* (2013.01); *H01L 24/29* (2013.01); *H01L 2224/29139* (2013.01); *H01L 2224/29294* (2013.01); *H01L 2224/29295* (2013.01); *H01L 2224/29339* (2013.01); *H01L 2224/29347* (2013.01); *H01L 2224/32225* (2013.01); *H01L 2224/755* (2013.01); *H01L 2224/7511* (2013.01); *H01L 2224/7525* (2013.01); *H01L 2224/75101* (2013.01); *H01L 2224/75102* (2013.01); *H01L 2224/75315* (2013.01); *H01L 2224/83048* (2013.01); *H01L 2224/83075* (2013.01); *H01L 2224/8384* (2013.01); *H01L 2224/83095* (2013.01); *H01L 2224/83101* (2013.01); *H01L 2224/83201* (2013.01); *H01L 2224/83204* (2013.01); *H01L 2224/83911* (2013.01); *H01L 2224/83948* (2013.01); *H05K 2203/0278* (2013.01); *H05K 2203/1131* (2013.01); *H05K 2203/1157* (2013.01)

(58) Field of Classification Search
 CPC ... H01L 2224/7525; H01L 2224/75101; H01L 2224/29139; H01L 2224/8384; H01L 2224/83075; H01L 2224/32225; H01L 2224/755; H01L 2224/83911; H01L 2224/29295; H01L 2224/29294; H01L 2224/83204; H01L 2224/83101; H01L 2224/83048; H01L 2224/75315; H01L 2224/7511; H01L 2224/29347; H01L 2224/29339; H01L 24/29; H01L 2224/75102; H01L 2224/83948; B22F 3/14; B22F 2301/255; B22F 2301/10; H05K 3/32; H05K 2203/1131; H05K 2203/0278; H05K 2203/1157; B23K 1/0016; B23K 2101/36–42
 USPC .. 228/248.1–248.5, 179.1–180.22, 218–220, 228/233.2
 See application file for complete search history.

(56) References Cited

U.S. PATENT DOCUMENTS

| | | | |
|---|---|---|---|
| 2,945,688 A * | 7/1960 | Pajenkamp | ........... C04B 7/4461 |
| | | | 106/742 |
| 3,112,388 A | 12/1963 | Wiant | |
| 3,480,842 A | 11/1969 | Scharli | |
| 3,501,288 A * | 3/1970 | Helmut | ........ C22B 1/02 |
| | | | 75/10.38 |
| 3,529,759 A | 9/1970 | Clark | |
| 3,896,541 A | 7/1975 | Golinski | |
| 4,202,690 A * | 5/1980 | Funke | ........ F27D 7/06 |
| | | | 419/57 |
| 4,252,263 A | 2/1981 | Houston | |
| 4,257,156 A | 3/1981 | Houston | |
| 4,340,902 A | 7/1982 | Honda et al. | |
| 4,348,339 A * | 9/1982 | Assmann | ........ G21C 3/623 |
| | | | 252/643 |
| 4,392,153 A | 7/1983 | Glascock, II et al. | |
| 4,591,537 A | 5/1986 | Aldinger et al. | |
| 4,800,421 A | 1/1989 | Davis et al. | |
| 4,903,885 A | 2/1990 | Schwarzbauer | |
| 4,903,886 A | 2/1990 | Schwarzbauer | |
| 5,074,533 A | 12/1991 | Frantz | |
| 5,099,310 A | 3/1992 | Osada et al. | |
| 5,213,248 A | 5/1993 | Horton et al. | |
| 5,247,425 A | 9/1993 | Takahasi | |
| 5,352,629 A | 10/1994 | Paik et al. | |
| 5,396,403 A | 3/1995 | Patel | |
| 5,653,376 A | 8/1997 | Nakamura et al. | |
| 6,003,757 A | 12/1999 | Beaumont et al. | |
| 6,108,205 A | 8/2000 | Bergstedt | |
| 6,161,748 A * | 12/2000 | Katayama | ............... H01L 24/75 |
| | | | 228/8 |
| 6,199,748 B1 | 3/2001 | Zhu et al. | |
| 6,383,446 B1 | 5/2002 | Tokita | |
| 6,390,439 B1 | 5/2002 | Cordes et al. | |
| 6,435,401 B1 * | 8/2002 | Miitsu | ................ B23K 1/018 |
| | | | 228/20.1 |
| 6,821,381 B1 | 11/2004 | Yamauchi et al. | |
| 8,822,036 B1 * | 9/2014 | Wereszczak | ........ H01L 23/3735 |
| | | | 228/120 |
| 9,688,060 B2 | 6/2017 | Bayerer et al. | |
| 9,956,643 B2 | 5/2018 | Matsubayashi | |
| 10,037,903 B2 | 7/2018 | Matsubayashi | |
| 10,083,844 B2 | 9/2018 | Matsubayashi et al. | |
| 2001/0005053 A1 * | 6/2001 | Kitae | ................ H01L 24/10 |
| | | | 257/736 |
| 2002/0045144 A1 | 4/2002 | Mori et al. | |
| 2003/0027371 A1 | 2/2003 | Sunagawa et al. | |
| 2004/0063058 A1 | 4/2004 | Orbeck et al. | |
| 2004/0063251 A1 | 4/2004 | Ootsuka et al. | |
| 2004/0157362 A1 | 8/2004 | Beroz et al. | |
| 2005/0277244 A1 * | 12/2005 | Galster | ................ H05K 3/0014 |
| | | | 438/202 |
| 2006/0186423 A1 | 8/2006 | Blonder et al. | |
| 2006/0210705 A1 * | 9/2006 | Itoh | ........... H01B 1/22 |
| | | | 427/96.1 |
| 2006/0266792 A1 | 11/2006 | Ko et al. | |
| 2007/0131353 A1 * | 6/2007 | Gobl | ........ H01L 24/32 |
| | | | 156/297 |
| 2008/0073776 A1 * | 3/2008 | Suh | ........ H01L 23/3736 |
| | | | 257/706 |
| 2008/0156398 A1 * | 7/2008 | Yasuda | ........ B23K 35/34 |
| | | | 148/23 |
| 2009/0032570 A1 | 2/2009 | Matsumura | |
| 2009/0039507 A1 * | 2/2009 | Funaki | ........ H01L 24/03 |
| | | | 257/737 |
| 2009/0283575 A1 | 11/2009 | Budd et al. | |
| 2009/0302485 A1 | 12/2009 | Fan | |
| 2009/0325116 A1 * | 12/2009 | Matsuura | ........ F27B 5/14 |
| | | | 432/198 |
| 2010/0051319 A1 * | 3/2010 | Schmitt | ........ B23K 35/3006 |
| | | | 174/126.1 |
| 2010/0055828 A1 * | 3/2010 | Schmitt | ........ B22F 1/0059 |
| | | | 438/98 |
| 2010/0090328 A1 * | 4/2010 | Goebl | ........ H01L 24/01 |
| | | | 257/687 |
| 2010/0093131 A1 * | 4/2010 | Maeda | ........ B23K 1/0016 |
| | | | 438/107 |
| 2010/0224674 A1 | 9/2010 | Liu et al. | |
| 2011/0114708 A1 * | 5/2011 | Maeda | ........ B22F 1/0062 |
| | | | 228/248.1 |
| 2011/0259876 A1 * | 10/2011 | Breznak | ........ B23K 1/002 |
| | | | 219/615 |
| 2011/0290863 A1 * | 12/2011 | Kajiwara | ........ B22F 3/22 |
| | | | 228/227 |
| 2012/0037688 A1 * | 2/2012 | Kock | ........ H01L 24/34 |
| | | | 228/208 |
| 2012/0052402 A1 * | 3/2012 | Turek | ........ C25B 11/035 |
| | | | 429/405 |
| 2012/0153011 A1 * | 6/2012 | Schafer | ........ B22F 1/0062 |
| | | | 228/248.1 |
| 2012/0247664 A1 | 10/2012 | Kobayashi | |
| 2013/0092310 A1 | 4/2013 | Ishigami et al. | |
| 2013/0250538 A1 * | 9/2013 | Le | ........ B23K 3/085 |
| | | | 361/807 |
| 2013/0271248 A1 * | 10/2013 | Nagata | ........ H01F 1/0311 |
| | | | 335/302 |
| 2014/0127072 A1 | 5/2014 | Chen et al. | |
| 2015/0037197 A1 * | 2/2015 | Komatsu | ........ H01L 24/83 |
| | | | 419/45 |

(56) References Cited

U.S. PATENT DOCUMENTS

| | | | |
|---|---|---|---|
| 2015/0077895 A1 | 3/2015 | Jindo et al. | |
| 2015/0090768 A1* | 4/2015 | Kuroda | B23K 1/005 228/46 |
| 2015/0243417 A1 | 8/2015 | Sun | |
| 2015/0257280 A1 | 9/2015 | Ciliox et al. | |
| 2016/0059361 A1* | 3/2016 | Schafer | C01G 55/004 361/760 |
| 2016/0190046 A1* | 6/2016 | Fontana | H01L 21/561 257/676 |
| 2017/0141074 A1* | 5/2017 | Schafer | B23K 35/3006 |
| 2017/0229418 A1 | 8/2017 | Osterwald et al. | |
| 2017/0326640 A1* | 11/2017 | Schmitt | B22F 1/0011 |
| 2018/0236672 A1* | 8/2018 | Scotchmer | G21F 7/02 |
| 2020/0114583 A1 | 4/2020 | Wen et al. | |

FOREIGN PATENT DOCUMENTS

| | | |
|---|---|---|
| CN | 101111932 A | 1/2008 |
| CN | 101371346 A | 2/2009 |
| CN | 101490831 A | 7/2009 |
| CN | 102709203 A | 10/2012 |
| CN | 103081088 A | 5/2013 |
| CN | 102569110 B | 6/2014 |
| DE | 102007047698 A1 | 4/2008 |
| DE | 10 2008 009 510 B3 | 7/2009 |
| DE | 102008048869 A1 | 4/2010 |
| DE | 10 2010 020 696 A1 | 11/2011 |
| DE | 10 2010 020 696 B4 | 11/2012 |
| DE | 10 2013 003 527 A1 | 9/2014 |
| EP | 2 278 032 A2 | 1/2011 |
| GB | 496763 A * 12/1938 | ............... B22F 7/04 |
| GB | 558382 A * 1/1944 | ............. H05B 6/101 |
| GB | 1459475 A * 12/1976 | |
| JP | 53118202 A * 10/1978 | |
| JP | 64-005026 | 1/1989 |
| JP | 2003-347360 A | 12/2003 |
| JP | 2004-296746 A | 10/2004 |
| JP | 2006-352080 A | 12/2006 |
| KR | 2012-0090202 A | 8/2012 |
| WO | WO 2008/125726 A1 * 6/2013 | |
| WO | 2014/003107 A1 | 1/2014 |
| WO | 2014/129626 A1 | 8/2014 |
| WO | WO-2014129626 A1 * 8/2014 | ............. H01L 24/29 |
| WO | 2014/135151 A2 | 9/2014 |

OTHER PUBLICATIONS

Machine translation of WO2014/129626A1 (no date available).*
International Search Report for PCT Serial No. PCT/EP2015/071613 dated Dec. 9, 2015.
"Die Niedertemperatur-Verbindungstechnik der Leistungselektronik" by Christian Mertens (Jan. 1, 2004), Book series: Fortschritt-Berichte VD1, Reihe 21, Elektrotechnik, No. 365, VDI Verlag, Dusseldorf, Germany, pp. 1-35, 72-101, 116-141; and English translation of pertinent parts thereof.
"Reduction of Thermomechanical Stress by Applying a Low Temperature Joining Technique" by S. Klaka et al, Proceedings of the International Symposium on Power Semiconductor Devices (May 31-Jun. 2, 1994), Davos, Switzerland, pp. 259-264.
C-THERM Technologies "Summary of Coeffcient of Linear Expansion (CTE) of Metals" (2020).

* cited by examiner

PROCESS AND DEVICE FOR LOW-TEMPERATURE PRESSURE SINTERING

CROSS-REFERENCE TO RELATED APPLICATIONS

This application is a National Stage application of International Patent Application No. PCT/EP2015/071613, filed on Sep. 21, 2015, which claims priority to German Patent Application No. 102014114093.1, filed on Sep. 29, 2014, each of which is hereby incorporated by reference in its entirety.

TECHNICAL FIELD

The invention relates to a process and to a device for producing an electronic subassembly by low-temperature pressure sintering, comprising the following steps: arranging an electronic component on a circuit carrier having a conductor track, and connecting the electronic component to the circuit carrier by the low-temperature pressure sintering of a joining material which connects the electronic component to the circuit carrier.

BACKGROUND

A process of this type is known, for example, from DE 10 2008 009 510 B3.

A fundamental disadvantage of low-temperature pressure sintering is that the heating up of the components and circuit carriers to be joined not only accelerates the diffusion of the joining material introduced, e.g. silver (Ag), into the connecting metals of the parts to be joined, e.g. precious metals including gold (Au), silver (Ag), platinum (Pt), palladium (Pd), rhodium (Rh), but also assists the oxidation of metallic surfaces. Thus, for example, the oxidation of copper (Cu) begins visibly to proceed more quickly at 80° C. than at room temperature.

Therefore, after going through the pressure sintering process, untreated electronic subassemblies regularly have a highly oxidized state, manifested by a uniformly matt-brown surface rather than the originally bright pink-red copper surfaces.

In order to prevent oxidation of these metal surfaces, a known countermeasure is to coat the copper conductor tracks or conductor areas and the component joining areas with precious metals to protect against oxidation. In particular, Ni-flash Au or Ni—Pd coatings are used for this purpose.

A disadvantage of this protective measure, however, is the increased amount of work and costs, and it has additionally been found that the surfaces treated in this way slow the oxidation, but do not prevent it entirely. In particular, it has been found in experiments that it has not been possible to carry out 2-stage sintering operations, i.e. processes with two sintering operations one after the other, on surfaces protected by these means.

SUMMARY

It is therefore an object of the invention to provide a process for producing an electronic subassembly by means of low-temperature pressure sintering which makes it possible to effectively prevent oxidation of the exposed metal surfaces of the electronic subassembly, in particular of the conductor track(s) and component connections.

According to the invention, this object is achieved by the process and the device having the features of the independent claims. The dependent claims describe advantageous configurations of the invention.

The basic concept of the invention is that of preventing oxidation of the metallic surfaces by the almost complete exclusion of oxygen when carrying out the (thermal) sintering process, in which respect it has been found that complete exclusion of oxygen, i.e. an oxygen-free atmosphere, is obstructive to the sintering operation. According to the invention, the oxygen content for the sintering operation is therefore to be set to a minimum of between 0.005 and 0.3%. Specifically, a quantity small enough so that oxidation processes do not or scarcely take place, and just enough that the sintering operation can proceed successfully and leads to a durable product.

In principle, an upper die and/or a lower die can be provided for the sintering operation, at least one of the two dies being heatable. It is expedient to arrange the circuit carrier on the lower die, the upper die serving to generate a counterpressure. Thus the electronic component is subjected to low-pressure pressure sintering by pressure generated between the upper die and the lower die, with the circuit carrier, by a relative movement of the upper die and the lower die towards one another. To this end, the lower die or the upper die can be movable, or both dies can be moved relative to one another to generate a pressure. It is preferable that the lower die is moved against the stationary upper die, the upper die comprising a pressure pad for quasi-hydrostatic pressure distribution. It is preferable for press mobility that the lower die and/or the upper die is electrohydraulically driven.

In particular, it has been found in the case of sintering devices having an upper die with a pressure pad, that the pressure pad, for example a silicone pad, receives and stores large proportions of oxygen under atmospheric conditions. This increases the oxidation of the metallic parts to be connected during the pressing operation. Therefore, the sintering operation can proceed in a virtually oxygen-free atmosphere as long as an oxygen-containing material is present which contains sufficient oxygen, and which releases it under pressure, such that, in the course of the sintering operation, the aforementioned minimum oxygen concentration in the process atmosphere can be achieved directly at the sintering location by the application of pressure and temperature. An example of such an oxygen-containing material could be a separating film for separating the pressure pad from the component to be sintered, which rests directly on the component to be sintered. It is therefore absolutely necessary for the sintering operation to take place inside a gastight-closable chamber, in which gas replacement of the ambient atmosphere by a low-oxygen atmosphere can take place. By contrast, pure gas dilution by flooding with gases has proved to be inadequate.

In particular it is particularly advantageous, before the sintering operation, to equilibrate the pressure pad, and/or a separating film between the pressure pad and the sintering component, with the low-oxygen atmosphere and to thereby displace oxygen molecules which adhere to the pressure pad or have diffused into it, and to remove these oxygen molecules from the chamber. The materials of which the pressure pad and/or the separating film comprise may absorb gases (including oxygen) from the environments in which they are stored in a similar way to which a sponge may absorb liquids. Such absorbed gases may not immediately leave the materials when the ambient atmosphere is changed, and may continue to diffuse out of the material for a period of time after such a change of atmosphere. In the current invention this may be critical since atmospheric gases, including oxygen, released by the pressure pad and/or separating film materials into the chamber after the chamber has been closed and the atmosphere change, increase the amount of oxygen present is what is preferably a low-oxygen atmosphere. To avoid this happening, after the ambient atmosphere (including oxygen) has been pumped out of the chamber, a period of time for the equilibration of the materials is found to be beneficial. During this period of time the oxygen (and other gases) previously absorbed by the materials of which the pressure pad and/or the separating film comprise may diffuse into the chamber and can be pumped out before the sintering process is started. According to the invention, the period of time which is allowed for equilibration is 0.5 minutes to 20 minutes. Preferably, the period of time which is allowed for equilibration is between 1 minute and 10 minutes, particularly preferably between 3 minutes and 5 minutes. It has also been found that an elevated temperature (a temperature above the ambient temperature) reduces the time required for equilibration, and this is a distinct advantage in shortening the overall cycle time of the inventive method and thus the throughput of electronic subassemblies. The upper limit of such an elevated temperature will be given by the oxidation speed of the material to be sintered. In a case where copper surfaces are being sintered then according to the invention, the temperature of the components within the chamber during equilibration is between 80 and 100 degrees C. Preferably, the temperature of the components within the chamber during equilibration is between 85 and 95 degrees centigrade.

It is advantageous that the separating film consists of a polymer, in particular Teflon (PTFE), since this material is changeable in shape and stable under pressure and prevents contamination of the component to be sintered through material detaching from the pressure pad, in particular silicone residues.

As is known, the process for producing an electronic subassembly by low-temperature pressure sintering thus comprises the steps of arranging an electronic component on a circuit carrier having a conductor track, and connecting the electronic component to the circuit carrier by the low-temperature pressure sintering of a joining material which connects the electronic component to the circuit carrier. According to the invention, it is provided here that, to avoid the oxidation of the electronic component or of the conductor track, the low-temperature pressure sintering is carried out in a low-oxygen atmosphere having a relative oxygen content of 0.005 to 0.3%. The low-oxygen atmosphere preferably has a relative oxygen content of 0.05 to 0.25%, particularly preferably of 0.05 to 0.15%.

The low-oxygen atmosphere preferably comprises nitrogen (N), carbon dioxide ($CO_2$), a noble gas or a mixture of the aforementioned gases, it merely being necessary to pay attention to the aforementioned oxygen proportion which is beneficial to the sintering operation.

If it should be found in a given case that the electronic subassembly is partially oxidized after the low-temperature pressure sintering, the electronic subassembly can be sparged or evaporation-coated with a reducing agent. Methanoic acid ($CH_2O_2$) is suitable with preference for evaporation-coating.

The joining material used is preferably silver (Ag) available in the form of a silver-comprising sintering paste. It is conceivable to provide a Cu/Ag powder, a silver alloy and further constituents in the sintering paste. The sintering paste can be arranged in platelet form between the electronic component and the circuit carrier, and therefore it is possible to achieve simple prefabrication and a uniform coating of the contact point with paste.

It is advantageous that the sintering temperature lies between 230° C. and 300° C., preferably between 240° C. and 280° C., in particular is 250° C., in order to produce a reliable sintered connection in an energy-efficient manner.

It is advantageous that the sintering pressure is between 20 MPa and 40 MPa, preferably between 25 MPa and 35 MPa, in particular is 30 MPa, in order to produce a reliable sintered connection in an energy-efficient manner.

The electronic components can be passive or active components.

A secondary aspect of the invention proposes a device for carrying out one of the aforementioned processes. The device comprises a first chamber (preheating chamber) having a heating device for heating the electronic subassembly up to as much as 100° C. A second chamber (sintering chamber) having an upper and a lower die for carrying out the low-temperature pressure sintering at a temperature of up to 300° C. and a pressure of up to 30 MPa is connected to the first chamber. At least one of the two dies, preferably both dies, are heatable. Furthermore, provision is made of a third chamber (cooling-down chamber), connected to the second chamber, for cooling down the sintered electronic subassembly to 80° C. At least the second chamber is gastight-closable and equipped with means for generating the low-oxygen atmosphere.

Alternatively, provision can be made of an individual sintering chamber set up to carry out the pressure chamber sintering under pressure and temperature. This individual chamber can furthermore be set up to preheat and/or cool down the electronic subassembly.

Alternatively, provision can be made of a preheating chamber and a sintering chamber with a cooling-down capability or a sintering chamber with a preheating capability with a connected cooling-down chamber.

It is advantageous that provision can be made of a fourth chamber (reducing chamber), which connects the second chamber to the third chamber and has means for introducing a gaseous or vaporous reducing agent, in particular formic acid. Alternatively, means for introducing a sparged or evaporation-coating reducing agent can be provided in a single sintering chamber or in the third chamber (cooling-down chamber). The reducing chamber can comprise a heating device designed to support a relatively flat cooling-down ramp from the sintering temperature to the cooling-down temperature, such that the electronic component can already be cooled down in a controlled manner in the reducing chamber during the reducing operation, in order to shorten a cooling-down time or to achieve a desired flat temperature cooling-down ramp of the component temperature.

It is preferable that two adjacent chambers, in particular all chambers, can be connected in a gastight manner and in particular in a vacuum atmosphere by means of chamber separating devices. The chamber separating device can be in the form of a transfer device with two vacuum gate valves or in the form of a valve gate device with a vacuum gate valve. Temperatures and atmospheric conditions which are separated from one another can thereby be provided in the individual chambers.

In principle, two or more chambers are arranged linearly in succession, such that an electronic component can be processed in sequence in a linear cycle process. Alternatively, it is conceivable to arrange the chambers in an arc or in a circle, in which case the components to be processed can be guided into and removed from each chamber centrally, and can be brought into a different chamber, such that a round cycle process can be implemented. In this respect, the chambers cannot be connected to one another, but instead have transfer or gate devices to a moving device, in particular to a transportation robot, which can transport a component from one chamber into a further chamber. In this case, in the absence of one chamber, another chamber can perform the task thereof, without the manufacturing process being interrupted, as a result of which it is possible to achieve a high degree of flexibility and a reduced susceptibility of the sintering process to interference.

In an advantageous development, provision can be made of an electrohydraulic drive of the lower die, the lower die having a die cylinder. The die cylinder can comprise a piston rod and a piston ring in a hydraulic sump, the piston rod having a diameter which is greater than or equal to the die diameter of the lower die. The piston rod can be axially guided and held in the cylinder housing by the piston ring. This provides a press device in the sintering chamber which can be formed as a compact structural unit and can achieve a high degree of parallelism of the die surfaces and also precise X/Y orientation of upper die and lower die and also a uniform pressure generation.

BRIEF DESCRIPTION OF THE DRAWINGS

The invention will be explained in more detail on the basis of an exemplary embodiment shown in the accompanying drawings, in which.

DETAILED DESCRIPTION

Figure 1:
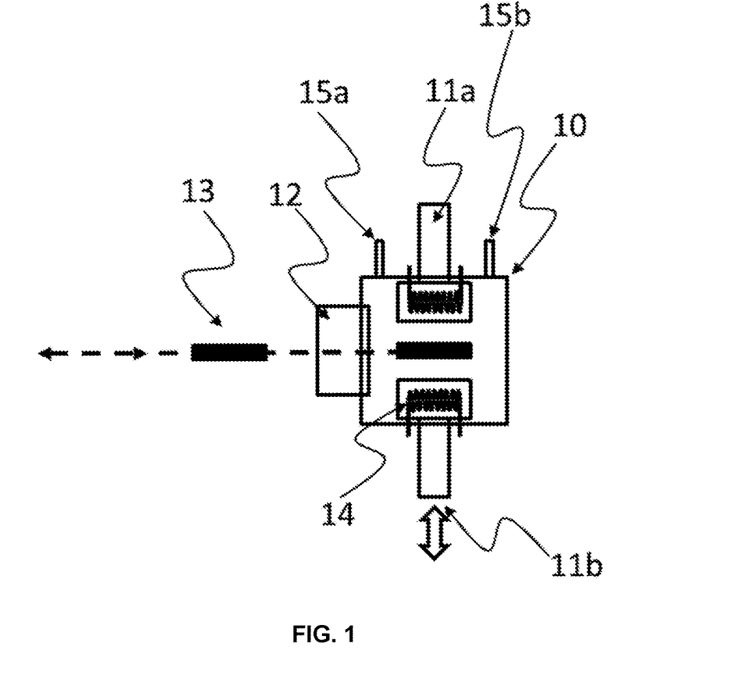
FIG. 1 shows a device for carrying out the process for producing an electronic subassembly by means of low-temperature pressure sintering having a single sintering chamber.

FIG. 1 shows a device for carrying out the process for producing an electronic subassembly by means of low-temperature pressure sintering having a single sintering chamber.

The single sintering chamber 10 has a charging opening 12 for a work carrier 13, which is set up to receive a subassembly to be processed. Within the sintering chamber 10 there is a press, consisting of the respectively heatable/coolable lower and upper die units 11a and 11b. To carry out the process according to the invention, the work carrier 13 passes the charging opening 12 and is placed between the lower and upper die units 11a and 11b, the subassembly (not shown) being sintered by moving the dies 11a, 11b together and by heating. It is furthermore conceivable that one of the two dies 11a, 11b is stationary and the respective other die 11a, 11b moves in relation to the stationary die 11a, 11b. After completion of the sintering, the work carrier 13 with the subassembly is removed again through the charging opening 12 by being moved out. A parallel relative orientation of the two dies 11a, 11b which is precise in an X/Y plane is desirable to generate a constant sintering pressure, and this can be achieved by way of a setting device (not shown) of a press device. The setting device can adjust the upper and/or the lower die 11a, 11b with respect to one another in an X/Y direction and bring about a parallel orientation of the die surfaces.

Optionally, a reduction of any oxide films present may be performed in the sintering chamber 10 after the sintering operation and opening of the dies 11a, 11b. The creation of a sintering atmosphere takes place through the filling and emptying nozzles 15a, 15b after charging the sintering chamber 10 with the work carrier 13.

Figure 2:
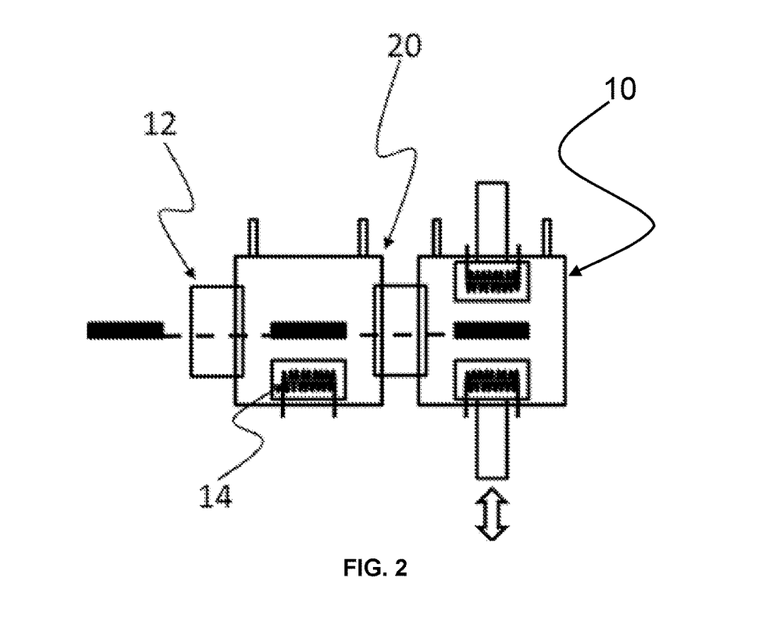
FIG. 2 shows a device for carrying out the process for producing an electronic subassembly by means of low-temperature pressure sintering having two sintering chambers.

FIG. 2 shows a preferred configuration of a device for carrying out the process for producing an electronic subassembly by means of low-temperature pressure sintering having two sintering chambers.

The structure of this device is largely identical to the structure shown in FIG. 1, but supplemented by a chamber 20 which is arranged upstream of the sintering chamber 10 and in which the substrate is preheated in an oxygen-free manner and is also cooled down in an oxygen-free manner after the sintering in the sintering chamber 10. An advantage of the 2-chamber solution over the 1-chamber solution shown in FIG. 1 is the faster cycle rate, since the heating system 14 in the sintering chamber 10 then does not have to heat the entire thermal mass to sintering temperature and cool it down again.

Figure 3:
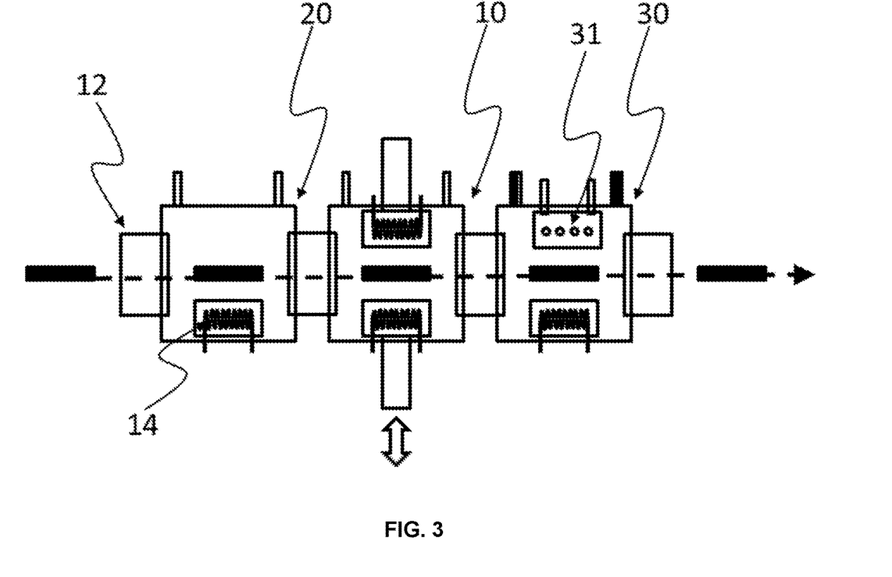
FIG. 3 shows a device for carrying out the process for producing an electronic subassembly by means of low-temperature pressure sintering having three sintering chambers.

FIG. 3 shows a device of particularly preferable configuration for carrying out the process for producing an electronic subassembly by means of low-temperature pressure sintering having three sintering chambers, the 3-chamber solution making it possible to pass the work carrier 13 in series through the first chamber 20 (oxygen-free heating up), the second (sintering) chamber 10 (low-oxygen sintering) and the third chamber 30 (oxygen-free cooling down to room temperature).

Figure 4:
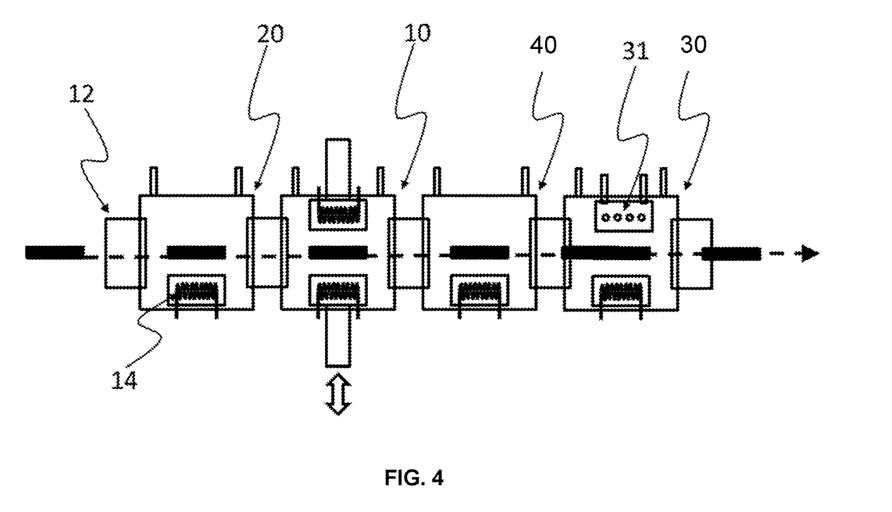
FIG. 4 shows a device for carrying out the process for producing an electronic subassembly by means of low-temperature pressure sintering having four sintering chambers.

FIG. 4 shows a device of extremely preferable configuration for carrying out the process for producing an electronic subassembly by means of low-temperature pressure sintering having four sintering chambers.

The 4-chamber solution largely corresponds in functionality to the 3-chamber solution, but is additionally equipped with a further (fourth) chamber 40 that allows the active reduction of residual oxides after sintering. The provision of a further chamber 40 between the second and third chambers 20, 30 as shown in FIG. 3 is particularly advantageous, since it has been found that the surfaces in vacuum furnaces are in practice covered with residues of the combustion products, where anchored clusters of oxygen form. These clusters are only dislodged after extended baking and evacuating phases. These baking phases are undesired while production is in progress, however.

It is therefore proposed to perform an active reduction of the oxygen clusters and oxide formations after the oxygen-free or low-oxygen sintering in the further chamber 40. This can preferably be performed by components of hydrogen or vaporous formic acid components (methanoic acid $CH_2O_2$).

The oxygen-free cooling down for discharging is subsequently possible in the fourth chamber 40.

The work carriers are generally transported in synchronous steps, in series through all of the chambers, the slowest process step in one of the 4 chambers determining the cycle time.

Figure 6:
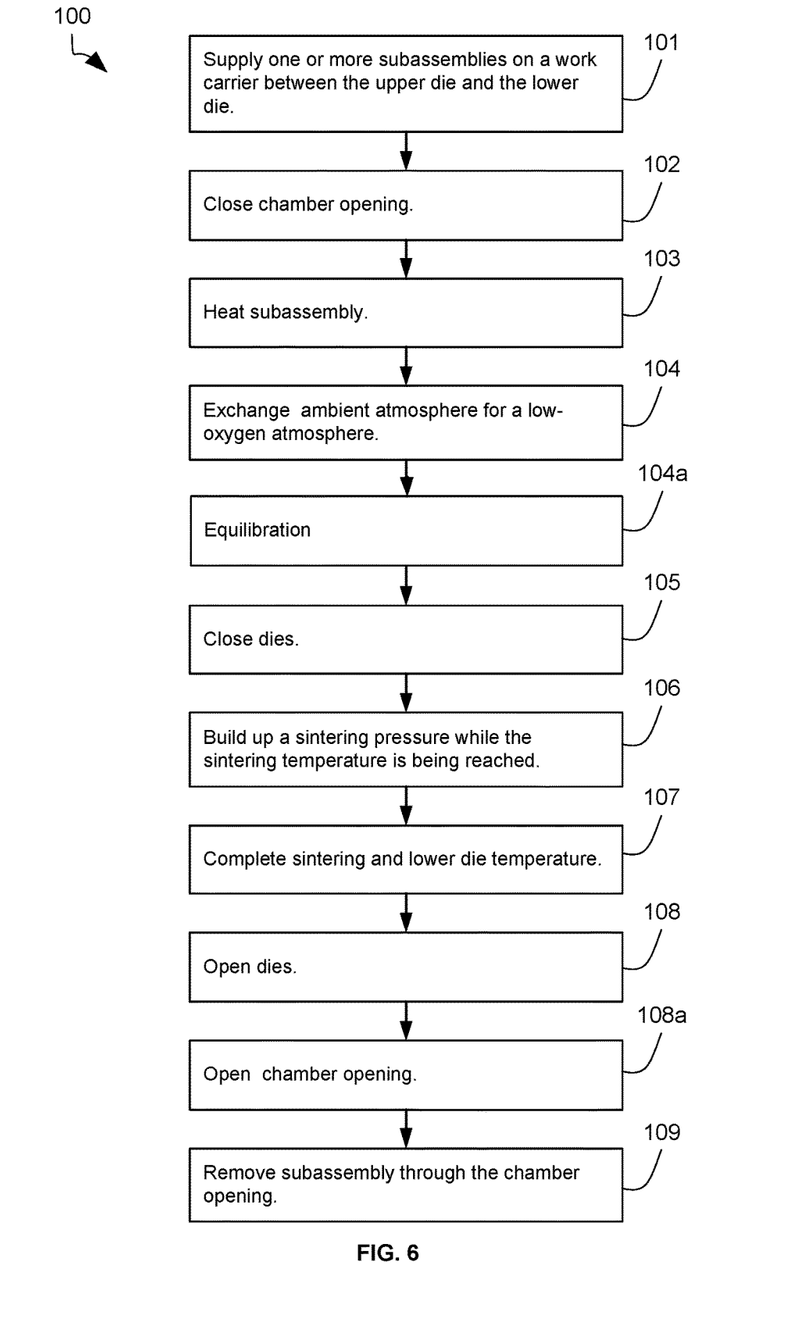
FIG. 6 shows a flow diagram of the method according to the invention.

The process 100 then proceeds as follows (see FIG. 6):
- supplying the subassembly to be sintered, or optionally subassemblies, on a work carrier through the gastight-closable opening into the pressure space between the upper die and the lower die 101;
- closing the opening 102 followed by heating 103, gas exchange of the ambient atmosphere for the (technical) low-oxygen atmosphere (e.g. nitrogen) 104, waiting for the materials within the chamber to equilibrate with the low-oxygen atmosphere 104a, closing the upper and lower dies 105, building up a sintering pressure while the sintering temperature is being reached 106;
- completion of the low-temperature pressure sintering and lowering of the die temperature to below 80° C. 107, opening the upper and lower dies 108, removal of the subassembly or the work carrier through the chamber opening 109; and
- providing the equipment for subsequent sintering.

In particular, the described chambers can have two gastight-closable openings, through which continuous, serial charging can take place through an inlet opening and the removal can take place through the second opening.

Figure 7:
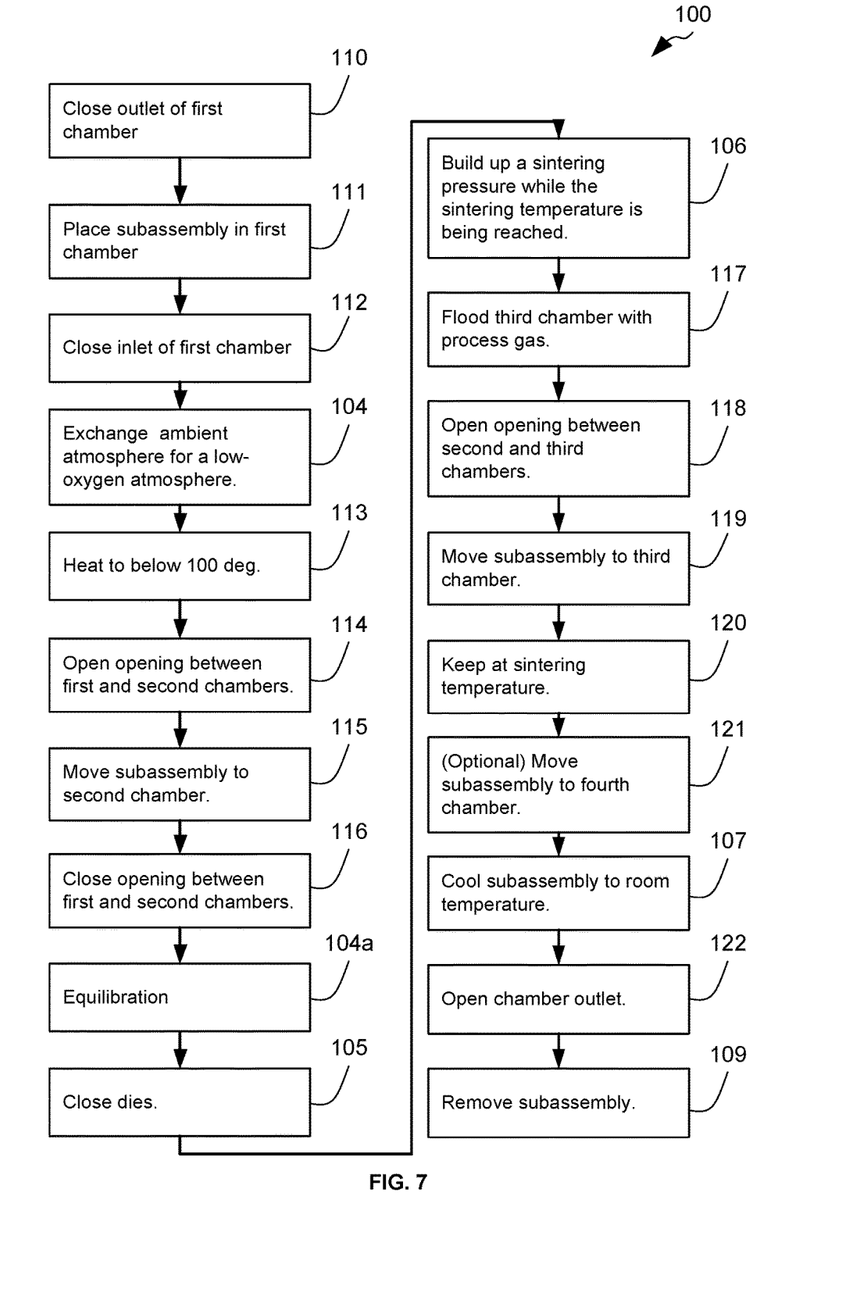
FIG. 7 shows a flow diagram of the method according to the invention in an embodiment utilising more than one chamber.

A continuous work flow and an increase in the throughput of the device are achieved by the following measures, which can also be applied individually, and are illustrated in FIG. 7:

In a first chamber 20 with an approximately gastight closure and an inlet opening, the work carrier is supplied 111 and the inlet opening is closed 112. The outlet opening of the first chamber 20 is also the inlet opening of the second chamber 10. This outlet opening is closed 110 when the inlet opening is open. When both gastight-closable openings are closed, the gas exchange 104 of the ambient atmosphere for the process gas atmosphere takes place in the first chamber 20.

After the gas exchange, heating of the work carrier takes place up to a limit below initial sintering (e.g. 100° C.) 113. Subsequently, the second opening is opened 114 and the work carrier is brought 115 by a transporting device from the first chamber 20 through the second opening into the second chamber 10.

In the second chamber 10, the process gas atmosphere permanently prevails. This second chamber 10 likewise has an inlet opening and an outlet opening. When the work carrier enters the second chamber 10, the outlet opening of the third chamber 40 is closed. In the second chamber 10, the work carrier is placed between the upper die and the lower die of the compaction device. The materials within the chamber are then allowed to equilibrate with the low-oxygen atmosphere for a period of time 104a. Then, the further heating of the work carrier and the compaction of the joining layer are brought about by moving the upper die and the lower die together 105. It has been found that the compaction also has a positive influence on the heat transfers, and therefore the heating is preferably performed with the dies moved together 106. After carrying out the sintering, the dies are moved apart and the third chamber 40 is flooded 117 with process gas. Subsequently, the third opening is opened 118 and the work carrier is brought 119 by a transporting device from the second chamber 10 through the third opening into the third chamber 40.

The third chamber 40 optionally has process gas enrichment with reducing constituents. These may be components of hydrogen or vaporous formic acid components (methanoic acid $CH_2O_2$). These substances reduce oxides occurring on the metals, copper oxides in particular. This helps to eliminate oxides in the event that the formation of oxides in the first and in the second chamber 20, 10 has not been prevented completely in the heating-up and sintering phases. During the dwell time in the third chamber 40, the work carrier is kept 120 at the sintering temperature. It has been found that the reduction of the oxides is then at an optimum, and at the same time the sintering continues.

The process gas enrichment can be permanently maintained in the third chamber 40. After completion of the reducing and sintering processes in the third chamber 40, the fourth chamber 30 is flooded with process gas (without reduction enrichment). Subsequently, the fourth opening is opened and the work carrier is brought 121 by a transporting device from the third chamber 40 through the fourth opening into the fourth chamber 30.

The fourth chamber 30 serves for cooling down 107 to room temperature under process gas, which is carried out until 80° C. is reached, the temperature at which continued oxidation become uncritical. The cooling is assisted by a dwelling plate for the work carrier set to 80° C. Through mechanical contact with the electronic component, the dwelling plate 31 can perform controlled cooling down by a predefinable temperature cooling ramp. The dwelling plate 31 can be in the form of a cooling or heating device through which fluid flows. When the temperature of 80° C. has been reached, the work carrier can be discharged 109 by opening 122 the fifth opening. This is followed by refilling the fourth chamber 30 with process gas for the next work carrier, which is fed in from the third chamber 40 for oxygen-free cooling down.

The functioning of the chambers and the activation of the transfer-gastight-closable openings are preferably synchronized by a common working cycle generator. The working cycle is determined by the slowest process step. This is the low-temperature pressure sintering in the second chamber 2, which takes about 10 minutes. Cycle rates of at least 3 minutes up to 21 minutes can likewise be set. It is of advantage for achieving the respective objectives of the processes in the chambers for the work carriers to dwell longer in chambers 20, 40 and 30, and this should therefore be tolerated without restriction. The individual objectives of the processes in the chambers are:

First chamber 20: oxygen-free heating up to as much as 100° C.

Second chamber 10: low-oxygen pressure sintering at a maximum of 300° C. and a maximum of 30 MPa Third chamber 40: optional reduction of residual oxides Fourth chamber 30: oxygen-free cooling down to 80° C.

Figure 5:
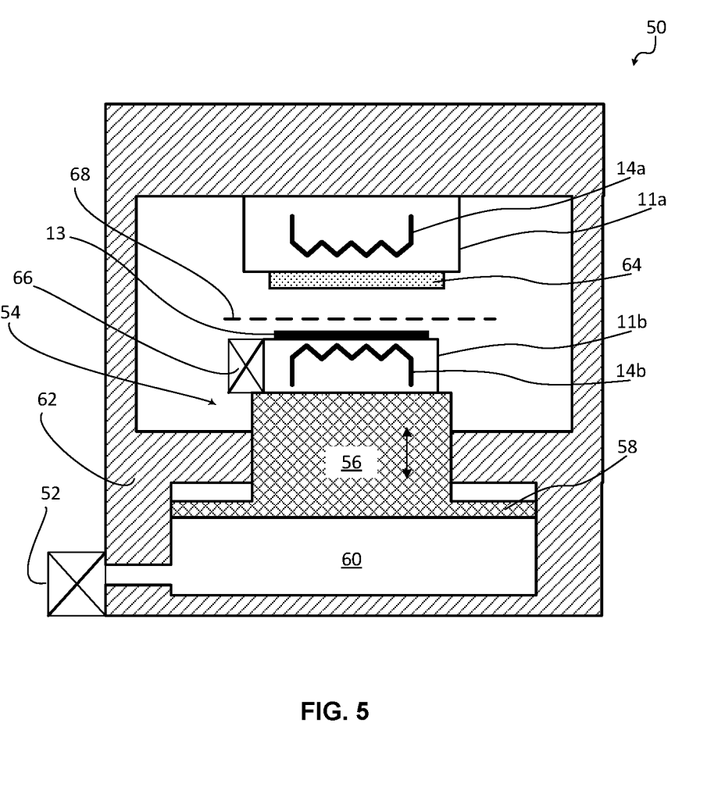
FIG. 5 shows a schematic structure of a press device for a sintering chamber according to the invention.

FIG. 5 shows an exemplary embodiment of a press device 50 for use in a sintering chamber 10. The press device 50 has an electrohydraulic drive 52, with the aid of which the lower die 11b can move against the stationary upper die 11a to generate the sintering pressure. The drive 52 is designed to achieve a press pressure of 30 MPa. The upper die 11a comprises a heating device 14a and the lower die 11b comprises a heating device 14b. A pressure pad 64 made of silicone is arranged on the upper die for generating an quasi-hydrostatic sintering pressure on a sintering component mounted on a work carrier 13. A separating film 68 for separating the pressure pad 64 from the component to be sintered rests directly on the component to be sintered during the sintering process. The lower die 11b is arranged on a die cylinder 54, the diameter of which is greater than the diameter of the lower die 11b. The die cylinder 54 comprises a piston rod 56, which is guided and oriented by a piston ring 58 in a hydraulic sump 60 of a cylinder housing 62 such that the surface of the lower die 11b is oriented parallel to the surface of the upper die 11a. The lower die 11b can be oriented with respect to the upper die 11a in the X/Y surface plane of the lower die 11b by means of a setting device 66. The piston ring 58 bears and guides the piston rod 56 and defines a uniform and oriented movement of the lower die 11b in a vertical direction towards the upper die 11b.

While the present disclosure has been illustrated and described with respect to a particular embodiment thereof, it should be appreciated by those of ordinary skill in the art that various modifications to this disclosure may be made without departing from the spirit and scope of the present disclosure.

What is claimed is:

1. A process for producing an electronic subassembly by low-temperature pressure sintering, comprising the following steps:
    arranging an electronic component on a circuit carrier having a conductor track,
    connecting the electronic component to the circuit carrier by the low-temperature pressure sintering of a joining material which connects the electronic component to the circuit carrier,
    where
    to avoid the oxidation of the electronic component or of the conductor track, the low-temperature pressure sintering is carried out in a closable sintering chamber comprising a low-oxygen atmosphere having a relative oxygen content of 0.005 to 0.3%, and
    where after the sintering chamber is closed, and the low oxygen atmosphere is initially established, a period of time elapses between when the low oxygen atmosphere is initially established and before the sintering is initiated to allow for the equilibration of materials within the chamber with the low oxygen atmosphere.

2. The process according to claim 1, wherein the low-oxygen atmosphere has a relative oxygen content of 0.05 to 0.25%.

3. The process according to claim 1, wherein the low-oxygen atmosphere has a relative oxygen content of 0.05 to 0.15%.

4. The process according to claim 1, wherein the sintering chamber is closed in a gastight manner.

5. The process according to claim 1, wherein the low-oxygen atmosphere comprises nitrogen (N), carbon dioxide ($CO_2$), a noble gas or a mixture of the aforementioned gases.

6. The process according to claim 1, wherein the electronic subassembly is sparged or evaporation-coated with a reducing agent after the low-temperature pressure sintering.

7. The process according to claim 6, wherein the reducing agent is methanoic acid ($CH_2O_2$).

8. The process according to claim 1, wherein the joining material is silver (Ag).

9. The process according to claim 1, wherein the sintering temperature lies between 230° C. and 300° C.

10. The process according to claim 1, wherein the sintering pressure is between 20 MPa and 40 MPa.

11. The process according to claim 9, wherein the sintering temperature lies between 240° C. and 280° C.

12. The process according to claim 11, wherein the sintering temperature is 250° C.

13. The process according to claim 10, wherein the sintering pressure is between 25 MPa and 35 MPa.

14. The process according to claim 13, wherein the sintering pressure is 30 MPa.

15. The process according to claim 1, wherein the period of time is between 0.5 minutes and 20 minutes.

16. The process according to claim 15, wherein the period of time is between 1 minute and 10 minutes.

17. The process according to claim 16, wherein the period of time is between 3 minutes and 5 minutes.

18. A process for producing an electronic subassembly by low-temperature pressure sintering, comprising:
    arranging an electronic component on a circuit carrier having a conductor track;
    connecting the electronic component to the circuit carrier by the low-temperature pressure sintering of a joining material which connects the electronic component to the circuit carrier, thereby producing the electronic subassembly;
    sparging or evaporation-coating the electronic subassembly with a reducing agent; and
    cooling the electronic subassembly from a sintering temperature reached due to the low-temperature pressure sintering;
    wherein the low-temperature pressure sintering is carried out in a closable sintering chamber comprising a low-oxygen atmosphere having a relative oxygen content of 0.005 to 0.3%; and
    wherein the sparging or evaporation-coating is carried out after the connecting of the electronic component to the circuit carrier by the low-temperature pressure sintering and before the cooling.

19. The process according to claim 18, wherein the reducing agent is methanoic acid ($CH_2O_2$).

20. The process according to claim 18, wherein the sparging or evaporation-coating is carried out in a reducing chamber and the cooling is carried out in a cooling-down chamber, wherein the reducing chamber is arranged between the closable sintering chamber and the cooling-down chamber.

21. A process for producing an electronic subassembly by low-temperature pressure sintering in a sintering chamber having a pressure pad, comprising the following steps:
    arranging an electronic component on a circuit carrier having a conductor track,
    connecting the electronic component to the circuit carrier by the low-temperature pressure sintering of a joining material which connects the electronic component to the circuit carrier,
    wherein to avoid the oxidation of the electronic component or of the conductor track, the low-temperature pressure sintering is carried out in a closable sintering chamber comprising a low-oxygen atmosphere having a relative oxygen content of 0.005 to 0.3%,
    wherein after the sintering chamber is closed, and the low oxygen atmosphere is initially established, a period of time elapses between when the low oxygen atmosphere is initially established and before the sintering is initiated, and
    wherein the connecting the electronic component to the circuit carrier by low-temperature pressure sintering includes pressing the electronic component, the circuit carrier and the pressure pad together such that the pressure pad provides quasi-hydrostatic pressure distribution to the electronic component.

* * * * *